United States Patent [19]

Lou

[11] Patent Number: 5,059,787
[45] Date of Patent: Oct. 22, 1991

[54] HIGH SPEED BROADBAND SILICON PHOTODETECTOR

[75] Inventor: Liang-fu Lou, Rancho Palos Verdes, Calif.

[73] Assignee: Northrop Corporation, Hawthorne, Calif.

[21] Appl. No.: 498,185

[22] Filed: Mar. 22, 1990

[51] Int. Cl.$^5$ ...................... H01J 40/14; H01L 27/14
[52] U.S. Cl. .................................. 250/211 J; 357/30
[58] Field of Search .................. 250/211 J; 357/4, 23, 357/30 I, 90, 30 D, 3 R, 16, 17, 19, 25, 208.1

[56] References Cited

U.S. PATENT DOCUMENTS 4,143,266  3/1979  Borel et al. .................... 357/30 I
4,346,395  8/1982  Ouichi ........................... 357/30 I Primary Examiner—David C. Nelms
Assistant Examiner—LaCharles P. Keesee, II
Attorney, Agent, or Firm—Terry J. Anderson; Robert B. Block

[57] ABSTRACT

A high speed wideband silicon photodetector is formed from a photosensitive junction in a relatively thin epitaxial layer of silicon grown on a sapphire substrate using SOS technology. The photodetector is backside illuminated, that is, illumination to be detected is cause to strike a receptor surface of the sapphire substrate so that it can reach the photosensitive junction in the silicon layer even with the shallower minimum penetration depths available at higher frequencies. A bias voltage may be applied to extend the depletion region from the photosensitive junction to the silicon sapphire interface. A magnesium fluoride anti-reflective coating may be used on the sapphire reflective surface.

4 Claims, 1 Drawing Sheet

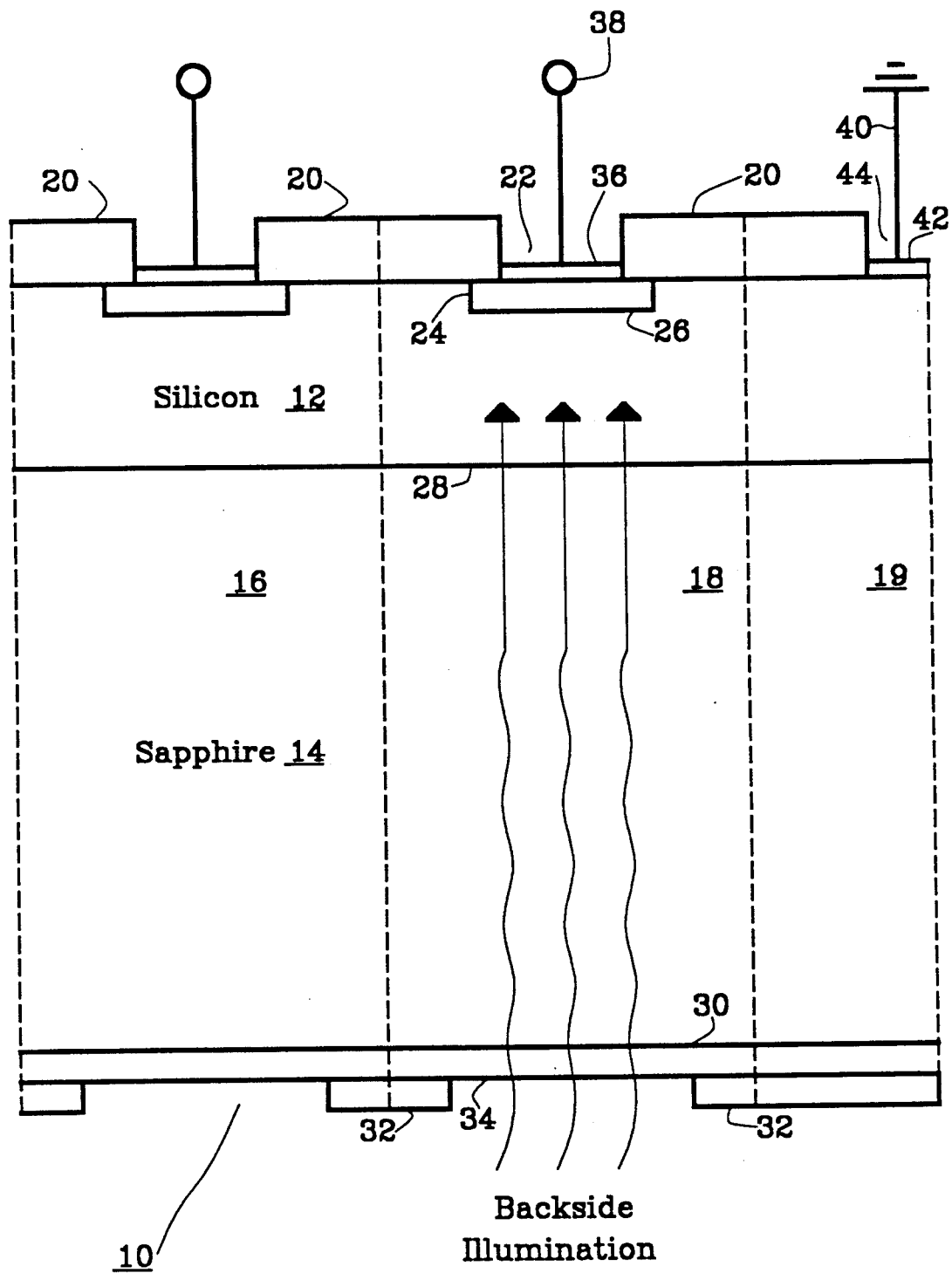

HIGH SPEED BROADBAND SILICON PHOTODETECTOR

BACKGROUND OF THE INVENTION

1. Field of the Invention

This invention relates to photodetectors and, in particular, to efficient, high-speed, wideband photodetectors suitable for both discrete detector elements as well as imaging arrays.

2. Description of the Prior Art

Conventional broadband photodetector devices have limited efficiencies at the shorter wavelengths, for example, when used for the detection of ultraviolet (UV) light in the microwave-frequency operating range. The efficiency of such photodetectors depends upon light penetration depth so that for UV photons with energies in the range of 3.5 to 5 eV, the penetration depth in commonly used semiconductor photodetectors is so shallow that special design considerations, or exotic semiconductor materials, need to be considered.

For the wavelengths of interest in IR or infra red applications, photodetectors are available which use a photosensitive epitaxial semiconductor layer on a transparent, compatible substrate material. In particular, a layer of mercury-cadmium-telluride (HgCdTe) is formed with a photosensitive junction on a substrate of cadmium-telluride (CdTe) or cadmium-zinc-telluride (CdZnTe). These substrates are transparent to IR radiation which is applied through the substrate for detection by the photosensitive junction in the semiconductor layer.

For the wavelengths of interest in UV applications, such as in UV laser radar photodetectors at wavelengths near 0.3 μm, the penetration depth in silicon (Si) and germanium (Ge) is shallower than about 100 Å. For gallium arsenide (GaAs), the penetration depth is only about 500 Å. These shallow penetration depths cause technical difficulties in the design and construction of p-n or p-i-n junction semiconductor photodetector devices because at least one side of the junction must be no wider than the penetration depth. Conventional photodetector designs are not available which can conveniently handle such shallow penetration depths between the active junction and the receptor surface for UV light with wavelengths as short as 0.3 μm.

SUMMARY OF THE INVENTION

The preceding and other shortcomings of the prior art are addressed and overcome by the present invention that provides a photodetector an epitaxial layer of silicon grown on a sapphire substrate, a photosensitive junction in the silicon layer, and means for applying the illumination to be detected to the junction through the substrate to minimize the penetration depth required for efficient detection.

In a further aspect, the invention provides means for applying a bias to the silicon layer to extend a depletion region from the photosensitive junction towards the first surface of the sapphire substrate.

In another aspect, the present invention provides a method of efficiently detecting a broadband of illumination by forming a photosensitive junction in a thin layer of epitaxial silicon grown on a sapphire substrate, and passing the illumination through the substrate to the junction to minimize the penetration depth required for detection.

In a further aspect, the invention includes the step of applying a bias to the silicon layer to extend the photosensitive junction depletion region towards the silicon-sapphire interface.

These and other features and advantages of this invention will become further apparent from the detailed description that follows which is accompanied by a drawing FIGURE. In the FIGURE and description, numerals indicate the various features of the invention, like numerals referring to like features throughout both the drawing and the description.

BRIEF DESCRIPTION OF THE DRAWING

The FIGURE is a cross sectional view of a portion of an array of high speed, broadband photodetectors configured from a silicon on sapphire (SOS) backside illuminated semiconductor junction device according to the present invention.

DETAILED DESCRIPTION OF THE PREFERRED EMBODIMENT(S)

The FIGURE shows a portion of high speed, broadband silicon photodetector array 10 which is constructed in accordance with conventional procedures for the manufacture of silicon on sapphire (SOS) devices. Silicon epitaxial layer 12 is grown on sapphire substrate 14. Silicon epitaxial layer 12 may conveniently be relatively thin, on the order of about 0.1–3 μm thick, while sapphire substrate 14 would conveniently be on the order of 1 mm in thickness.

The portion of photodetector array 10 shown in the FIGURE includes photodetectors 16 and 18 which may be two detectors in a vast matrix array. This portion of photodetector array 10 also includes contact portion 19, to be described below in greater detail, which provides the necessary second electrical connection for one or more photodetectors. photodetectors 16 and 18 may for example each represent one 40×40 μm pixel in an array of 128×128 pixels. In another application in which discrete photodetectors are required, photodetectors 16 and 18 would represent individual photodetector dies in a SOS wafer which have not yet been separated from the wafer during fabrication.

In any event, the operation of each photodetector, whether used as a discrete element or as part of an array, may be understood from the following discussion of photodetector 18. Photodetector 18 consists of a portion of sapphire substrate 14 upon which has been grown silicon epitaxial layer 12. A layer of silicon dioxide (Si)O2 is grown on the surface of silicon epitaxial layer 12 to provide masking or isolating layer 20. The portion of isolating layer 20 associated with photodetector 18 is formed with a generally central mask opening 22 therein during processing.

For the purposes of this explanation, photodetector array 10 is assumed to have been fabricated from a p-type SOS wafer with a carrier concentration of $2 \times 10^{15}/cm^3$. Silicon epitaxial layer 12 is doped during fabrication through opening 22 with n-type dopants, for example by implantation techniques, to a concentration of $10^{18}/cm^3$ or higher to form n+ region 24. Ion implanted n+p junction 26 is therefore formed at the interface between n-type region 24 and silicon epitaxial layer 12 at about 0.5 μm below the surface of silicon epitaxial layer 12. Junction 26 will have a depletion region extending towards interface 28 between silicon epitaxial layer 12 and sapphire substrate 14.

The extent of the depletion region depends upon the doping levels and material thicknesses. In the configuration discussed above, a direct current or DC bias of about 10 volts, applied between electrical leads 38 and 40, can be used to extend the depletion region from junction 26 all the way to interface 28. The bias voltage required to extend the depletion region to the silicon-sapphire interface for other configurations may be different. When the depletion region extends to the interface, carriers generated at interface 28 by photons applied by backside illumination applied to receptor surface 30 as discussed below, will be driven rapidly by the electric field in the depletion region toward junction 26 for detection.

As noted above, photodetector 18 is intended for operation by backside illumination. That is, the illumination to be detected is caused to strike receptor surface 30 at the opposite side of sapphire substrate 14 from interface 28 with silicon epitaxial layer 12. Masking material 32 is deposited on receptor surface 30 to separate the individual detectors of photodetector array 10. Masking material 32 is used to form an opaque grid coating to delineate pixels in an array, but may not be required in applications in which the individual dies are separated to form discrete photodetectors.

The transmittance of sapphire substrate 14 for wavelengths of interest in the range between 0.2 to 3 $\mu$m is quite good, i.e. greater than 80%. Improvement may be obtained with the addition of anti-reflection coating 34 on receptor surface 30 of sapphire substrate 14. Magnesium fluoride can be used as a single layer coating to form antireflection coating 34. This may improve transmission to 90% or better. The transmittance of sapphire substrate 14 is therefore greater than the transmittance of silicon epitaxial layer 12, which become the limiting material for wavelengths of illumination to be detected.

To form the complete electrical circuit for photodetector 18 and/or the other photodetectors within photodetector array 10, metalization 36 is formed within opening 22 and connected by conventional manufacturing techniques to electrical lead 38. The other electrical connection to photodetectors 16 and 18 is made by electrical lead 40 which is shown for convenience as a ground connection. Electrical lead 40 may serve as a connection for photodetector 18 alone or for a large array including many other photodetectors. Electrical lead 40 is connected to metalization 42 which is formed in opening 44 of isolating layer 20 on a portion of silicon epitaxial layer 12 which has not been doped. As noted above, a DC bias of about 10 volts applied between electrical lead 38 and electrical lead 40 may be used to extend the depletion region from the vicinity of junction 26 all the way to interface 28.

As can be seen from the above description of the construction and operation of photodetector 18, the low penetration depths associated with conventional silicon photodetectors has been overcome by the present invention by the use of a backside illuminated SOS configuration. Illumination to be detected strikes receptor surface 30, which may include antireflection coating 34, and is transmitted easily through the transparent window formed by sapphire substrate 14 to strike interface 28 and generate electric carriers. As noted above, the applied DC bias has extended the depletion region from the junction to the interface so that, upon entering the depletion region the carrier will be transported very quickly by the electric field to junction 26 for detection.

Photodetectors in accordance with the present invention can operate with a very broad band of illumination, from the visible bands to ultraviolet light, that is, wavelengths in the range of about 0.85 $\mu$m to about 0.2 $\mu$m.

The speed of carrier transport through the depletion region to junction 26 is fast enough for operation at up to 10 GHz, while retaining a high quantum efficiency of 50% or better. The is particularly important for applications requiring high speed switching rates, such as photodetectors used in UV laser detector applications. A very short UV laser pulse may be reflected from a high speed target and detected and distinguished in time from other such reflections by a detector, in accordance with the present invention, capable of cycling at up to 10 GHz.

While this invention has been described with reference to its presently preferred embodiment(s), its scope is not limited thereto. Rather, such scope is only limited insofar as defined by the following set of claims and all equivalents thereof.

What is claimed is:

1. A photodetector, comprising:
   a sapphire substrate having a first surface and a free surface;
   a p-doped silicon semiconductor layer formed on said first surface to form an interface with said substrate and a second surface spaced from said interface;
   means forming an n-type junction at said second surface;
   means for setting said p-doped silicon semiconductor layer to a reference potential,
   means for biasing said junction with respect to said reference potential to create and enlarge a depletion region to extend into contact with said substrate at the interface, whereby the entire region within said semiconductor between said junction and said interface is depleted;
   said substrate being open at the free surface away from said silicon semiconductor for receiving infrared radiation which passes through said interface and into said depletion region to generate carriers in said depletion region which are transported through said depletion region to said junction for detection.

2. The photodetector claimed in claim 1 wherein the depletion region extends from the photosensitive junction to the sapphire interface to permit 10 Ghz operation.

3. The photodetector claimed in claim 1, further comprising:
   an anti-reflective coating formed on the opposite substrate surface.

4. The photodetector claimed in claim 1, further comprising:
   an opaque grid coating formed on the opposite substrate surface to delineate the photosensitive region.

* * * * *